(12) United States Patent
Carillo et al.

(10) Patent No.: US 10,186,631 B2
(45) Date of Patent: Jan. 22, 2019

(54) SQUARED-OFF SEMICONDUCTOR COATINGS FOR QUANTUM DOTS (QDS)

(71) Applicant: Pacific Light Technologies Corp., Portland, OR (US)

(72) Inventors: Matthew J. Carillo, Portland, OR (US); Steven Hughes, Salem, VA (US)

(73) Assignee: OSRAM Opto Semiconductors GmbH, Regensburg (DE)

(*) Notice: Subject to any disclaimer, the term of this patent is extended or adjusted under 35 U.S.C. 154(b) by 0 days.

(21) Appl. No.: 15/311,839

(22) PCT Filed: May 14, 2015

(86) PCT No.: PCT/US2015/030822
§ 371 (c)(1),
(2) Date: Nov. 16, 2016

(87) PCT Pub. No.: WO2015/175800
PCT Pub. Date: Nov. 19, 2015

(65) Prior Publication Data
US 2017/0092805 A1 Mar. 30, 2017

Related U.S. Application Data

(60) Provisional application No. 61/994,718, filed on May 16, 2014.

(51) Int. Cl.
*H01L 29/06* (2006.01)
*H01L 33/06* (2010.01)
(Continued)

(52) U.S. Cl.
CPC .............. *H01L 33/06* (2013.01); *C09K 11/02* (2013.01); *C09K 11/025* (2013.01); *C09K 11/56* (2013.01);
(Continued)

(58) Field of Classification Search
CPC ....... C09K 11/025; B82Y 20/00; B82Y 40/00; Y10S 977/773–977/777; Y10S 977/89;
(Continued)

(56) References Cited

U.S. PATENT DOCUMENTS 9,368,693 B2 6/2016 Kurtin
2005/0017260 A1 1/2005 Lee
(Continued)

FOREIGN PATENT DOCUMENTS

KR 20130055058 5/2013

OTHER PUBLICATIONS

"International Search Report and Written Opinion for International Application No. PCT/US2015/030822, dated Aug. 27, 2015."
(Continued)

*Primary Examiner* — Kevin M Picardat
(74) *Attorney, Agent, or Firm* — Elliott, Ostrander & Preston, P.C.

(57) ABSTRACT

Squared-off semiconductor coatings for quantum dots (QDs) and the resulting quantum dot materials are described. In an example, a semiconductor structure includes a quantum dot structure having an outermost surface. A crystalline semiconductor coating is disposed on and completely surrounds the outermost surface of the quantum dot structure. The crystalline semiconductor coating has a geometry with squared-off ends.

23 Claims, 16 Drawing Sheets

(51) Int. Cl.
*H01L 33/50* (2010.01)
*C09K 11/02* (2006.01)
*C09K 11/56* (2006.01)
*C09K 11/88* (2006.01)
*B82Y 20/00* (2011.01)
*B82Y 40/00* (2011.01)

(52) U.S. Cl.
CPC .......... *C09K 11/883* (2013.01); *H01L 33/505* (2013.01); *B82Y 20/00* (2013.01); *B82Y 40/00* (2013.01); *Y10S 977/744* (2013.01); *Y10S 977/89* (2013.01); *Y10S 977/95* (2013.01)

(58) Field of Classification Search
CPC .... Y10S 977/95; Y10S 977/774; H01L 33/06; H01L 33/505; H01L 21/02601; H01L 51/0046; H01L 51/426–51/4266; B82B 3/00–3/0095; B82B 1/00–1/008; C01B 32/152–32/156
USPC ...................................... 257/13, 14
See application file for complete search history.

(56) References Cited

U.S. PATENT DOCUMENTS

| | | | |
|---|---|---|---|
| 2010/0046072 A1* | 2/2010 | Matsunami | B32B 17/10036 359/487.06 |
| 2010/0289003 A1 | 11/2010 | Kahen et al. | |
| 2013/0115455 A1* | 5/2013 | Banin | C09K 11/025 428/375 |
| 2013/0146834 A1 | 6/2013 | Cho et al. | |
| 2014/0049155 A1 | 2/2014 | Kurtin | |
| 2014/0117311 A1* | 5/2014 | Kurtin | H01L 29/127 257/22 |

OTHER PUBLICATIONS

Tessier, M.D., et al; "Spectroscopy of Colloidal Semiconductor Core/Shell Nanoplatelets with High Quantum Yield"; American Chemical Society, Nano Letters, vol. 13, No. 7, pp. 3321-3328, Jul. 10, 2013, USA.

Zhao, Y. et al; "High-Temperature Luminescence Quenching of Colloidal Quantum Dots"; American Chemical Society, ACS Nano, vol. 6, No. 10, pp. 9058-9067, Sep. 14, 2012, USA.

* cited by examiner

100

| Reagent | Amount (grams or uL) | Moles |
|---|---|---|
| Bis(trimethylsilyl)sulfide (or (TMS)2S) | 135 uL | 6.40E-04 |
| Neat Diethylzinc | 95.64 uL | 9.14E-04 |
| Neat Dimethylcadmium | 19.76 uL | 2.75E-04 |
| Oleylamine | 1.098 g | 4.10E-03 |
| Pacific Light Tech R2 Quantum Dots | Variable depending on concentration of stock solution | |
| Trioctylphopshine oxide | 13.5 grams | Not relevant - used as solvent |

WHITE LIGHT

SQUARED-OFF SEMICONDUCTOR COATINGS FOR QUANTUM DOTS (QDS)

CROSS-REFERENCE TO RELATED APPLICATIONS

The present patent application is a national phase application of International Application No. PCT/US2015030822, filed May 14, 2015, which claims priority to U.S. Application No. 61/994,718, filed May 16, 2014, the disclosures of which are incorporated herein by reference.

TECHNICAL FIELD

Embodiments of the present invention are in the field of quantum dots and, in particular, squared-off semiconductor coatings for quantum dots (QDs).

BACKGROUND

Quantum dots having a high photoluminescence quantum yield (PLOY) may be applicable as down-converting materials in down-converting nano-composites used in solid state lighting applications. Down-converting materials are used to improve the performance, efficiency and color choice in lighting applications, particularly light emitting diodes (LEDs). In such applications, quantum dots absorb light of a particular first (available or selected) wavelength, usually blue, and then emit light at a second wavelength, usually red or green.

SUMMARY

Embodiments of the present invention include squared-off semiconductor coatings for quantum dots (QDs).

In an embodiment, a semiconductor structure includes a quantum dot structure having an outermost surface. A crystalline semiconductor coating is disposed on and completely surrounds the outermost surface of the quantum dot structure. The crystalline semiconductor coating has a geometry with squared-off ends.

In an embodiment, a semiconductor structure includes a nanocrystalline core of a first semiconductor material. A nanocrystalline shell of a second semiconductor material different from the first semiconductor material is disposed on and surrounds the nanocrystalline core. A crystalline semiconductor coating of a third semiconductor material different from the first and second semiconductor materials is disposed on and completely surrounds the nanocrystalline shell. The crystalline semiconductor coating has a geometry with squared-off ends.

In another embodiment, a lighting apparatus includes a housing structure and a light emitting diode supported within the housing structure. The lighting apparatus also includes a light conversion layer disposed above the light emitting diode. The light conversion layer includes a plurality of quantum dots. Each quantum dot includes a nanocrystalline core of a first semiconductor material. A nanocrystalline shell of a second semiconductor material different from the first semiconductor material is disposed on and surrounds the nanocrystalline core. A crystalline semiconductor coating of a third semiconductor material different from the first and second semiconductor materials is disposed on and completely surrounds the nanocrystalline shell. The crystalline semiconductor coating has a geometry with squared-off ends.

In another embodiment, a lighting apparatus includes a substrate and a light emitting diode disposed on the substrate. The lighting apparatus also includes a light conversion layer disposed above the light emitting diode. The light conversion layer includes a plurality of quantum dots. Each quantum dot includes a nanocrystalline core of a first semiconductor material. A nanocrystalline shell of a second semiconductor material different from the first semiconductor material is disposed on and surrounds the nanocrystalline core. A crystalline semiconductor coating of a third semiconductor material different from the first and second semiconductor materials is disposed on and completely surrounds the nanocrystalline shell. The crystalline semiconductor coating has a geometry with squared-off ends.

BRIEF DESCRIPTION OF THE DRAWINGS

FIG. 1 includes a Table of amounts of key reagents for a standard synthetic procedure, in accordance with one or more embodiments of the present invention.

DETAILED DESCRIPTION

Figure 2A:
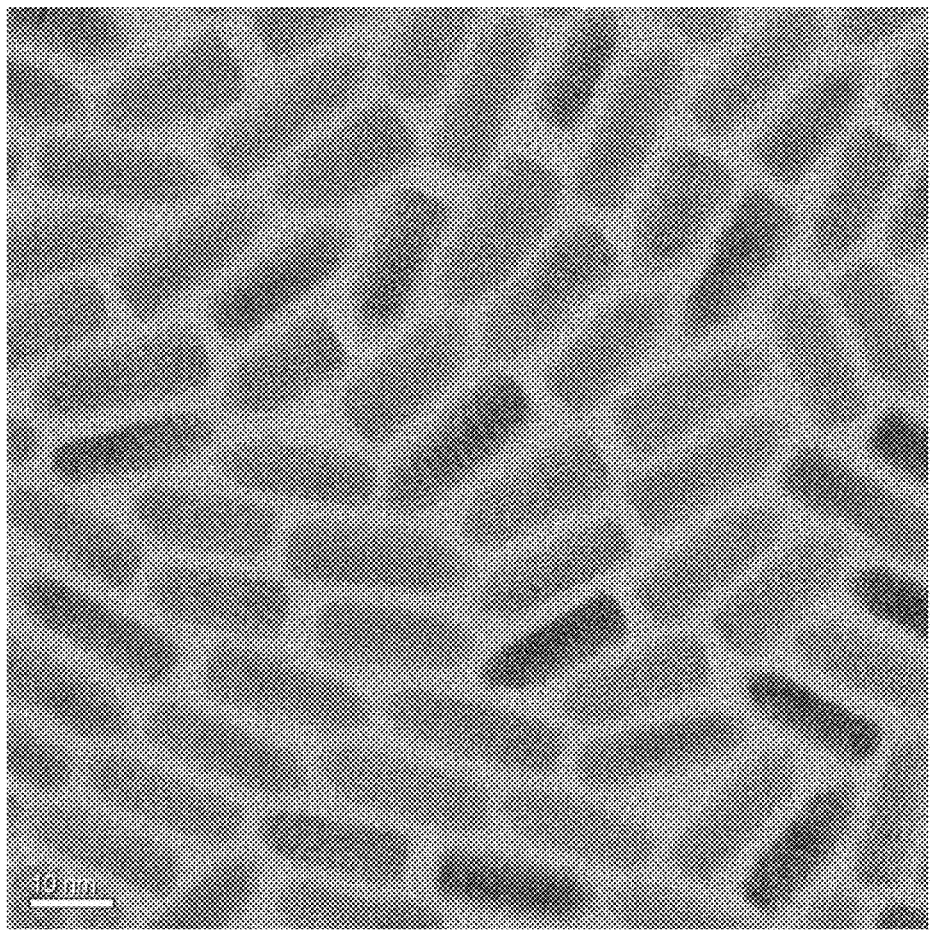
FIG. 2A is a TEM image of seeded rods (CdSe/CdS pairings), the ends of which are at least somewhat rounded.

Squared-off semiconductor coatings for quantum dots (QDs) and the resulting quantum dot materials are described herein. In the following description, numerous specific details are set forth, such as specific semiconductor coating materials, and quantum dot geometries and efficiencies, in order to provide a thorough understanding of embodiments of the present invention. It will be apparent to one skilled in the art that embodiments of the present invention may be practiced without these specific details. In other instances, well-known related apparatuses, such as the host of varieties of applicable light emitting diodes (LEDs), are not described in detail in order to not unnecessarily obscure embodiments of the present invention. Furthermore, it is to be understood that the various embodiments shown in the figures are illustrative representations and are not necessarily drawn to scale.

One or more embodiments described herein are directed to semiconductor coatings for quantum dots. Certain embodiments may be directed to very stable high performance semiconductor quantum dot materials that include a seeded rod semiconductor structure (nanocrystalline core/shell pairing) coated with a layer of a third semiconductor material. The third semiconductor material coating, which in at least some embodiments is a crystalline coating, has a geometry with squared-off ends. The geometry with squared-off ends may also be described as a regular "brick-like" structure. In some embodiments, such a semiconductor coating is formed on a core/shell pairing that is rod-shaped and has rounded ends. In a specific embodiment, the round ends transition to squared-off ends as the material of the core-shell pairing transitions to the material of the semiconductor coating.

In an embodiment, structures described herein have a PLQY of greater than 75% at high temperatures and incident flux (e.g., T greater than approximately 100 degrees Celsius, flux greater than approximately 10 W/cm$^2$). In an embodiment the structures described herein have at least three semiconductor layers, and potentially more, where a transition between the last two layers is graded to achieve an extremely regular outer surface. Not to be bound by theory, it is believed that particles having the structures described herein achieve such high PLQY under harsh conditions because the very regular-shaped surface is easy to passivate further, whether with inorganic insulating shells (i.e. silica shells) or ligands. Applications of such structures may include, but are not limited to, phosphors for LED's in lighting and display applications, phosphors for lighting in agriculture, biological markers, or fluorescent pigments in art materials.

To provide context, quantum dot structure such as quantum dot heterostructures (QDHs) may require protection in certain applications requiring higher, more reliable performance under the associated conditions of high incident intensity, high operating temperatures, and humidity. In accordance with an embodiment of the present invention, a QDH based on a nanocrystalline core of a first semiconductor material and a surrounding nanocrystalline shell of a second semiconductor material has a third semiconductor material coated there around. The third semiconductor material is applied as a coating that may provide an extra layer of protection for the quantum dot structure which results in a higher, more reliable performance under the conditions of high incident intensity, high operating temperatures, and humidity.

To provide further context, a general seeded-rod structure for luminescent quantum dots may include a CdSe "Seed" surrounded by a CdS rod. Although seeded-rod semiconductor quantum dots may exhibit a high photoluminescence quantum yield (PLQY), when a passivation layer of ZnS is added, the quantum yield is typically less than 75% at room temperature. In the rare instances where literature or prior art describes the performance of such ZnS-coated particles under high temperature LED operating conditions, it has been shown that even ZnS-coated particles will display a less than 75% quantum yield (QY). As such, the addition of ZnS alone is not sufficient to achieve good quantum yield at high temperatures.

One or more embodiments described herein is directed to a very high performance semiconductor quantum dot based on a seeded-rod architecture but including (at least) three epitaxial semiconductor layers. The three epitaxial layers can broadly be described as including a CdSe "Seed" (layer 1), which is covered by a CdS "Rod" (layer 2), which is then covered with a thin layer of ZnS (layer 3). In a specific embodiment, the third layer can be described as including two separate sub-layers, the first of which is a blended CdZnS layer directly grown from an underlying CdS rod. The second sub-layer is a more pure ZnS outer layer which may be stabilized with oleylamine molecules and which defines the surface of the particles.

In an exemplary embodiment, fabrication of the semiconductor coating involves using a mixture of Zn and Cd in order to grade an interface gradually between the Cd-rich layer and the Zn-rich layer. It is understood that such grading results in both a very regular surface and a very high quality interface, both of which are beneficial for PLQY. In a specific embodiment, a key factor here is a metal:chalcogenide molar ratio greater than 1 (e.g., in the example described below, the Zn:S ratio is 1.26:1). Embodiments may involve the use of relatively low temperature growth (e.g., in the example below the growth temperature is approximately 160 degrees Celsius). Embodiments may also include slow addition of the metal precursors (e.g., in the example described below, a syringe pump is used to deliver approximately 10 microliters per minute).

In an embodiment, the resulting structures can be described as having a semiconductor coating that is very regular and crystalline with a "brick-like" appearance. The brick-like appearance may be described as having squared-off ends (e.g., flattened ends and smooth sides, although they sometimes, though rarely, display slightly pointed ends). It is to be appreciated that the term "squared-off" need not imply perfectly right-angled corners. A flattening of the ends of the coating as compared to the curvature of the surrounded rod can, in an embodiment, satisfy the definition of a semiconductor coating having squared-off ends. The so-called third layer of semiconductor material is typically very thin on the sides of the rod, though in some variations of embodiments of the invention can be made to be relatively thicker. The third layer of semiconductor material is typically thicker on the ends of the rods, and the thickness of the third layer on the ends of the rods can also be changed in the different variations of embodiments of the present invention. Not to be bound by theory, it is believed that the smooth regular appearance of the outer ZnS sub-layer indicates a passivation of all surface defects in a way that promotes the highest possible photoluminescent quantum yield from the materials.

Embodiments described herein may be implemented to provide improved passivation (e.g., smoother surface, better ligand) for quantum dot structures. Other advantages may include a synthetic approach for providing an improved transition from CdS to ZnS, e.g., from a CdS quantum dot layer to a ZnS coating. Embodiments may be implemented to enable quantum dots to retain their high PLQY under high temperature and high flux operating conditions.

More specifically, it is believed that a reduction in quantum yield after the addition of ZnS is due to the incomplete or poor passivation of the outer surface of the underlying quantum dot. Reduction in PLQY may also be due to the large lattice mismatch between ZnS and the underlying materials (e.g., usually CdSe or CdS), conditions which are aggravated under relevant LED operating conditions. Therefore, embodiments of the present invention provide an approach for fabricating a layer surrounding a CdS quantum dot shell with a smoother transition from the lattice-mismatched CdS and ZnS, and which terminates in a smooth outer surface with an affinity for attached ligands (e.g., amines). Lastly, in an embodiment, the overall morphology of the particle after addition of the ZnS layer may remain with a very regular crystalline shape, compatible with a rod of aspect ratio 3 or higher.

In an exemplary synthesis, in accordance with an embodiment of the present invention, a standard reaction involves use of the amounts of key reagents as shown in Table 100 of FIG. 1. The use of trioctylphosphine oxide (TOPO) scales directly with the size of the reaction. Although not to be bound by theory, it is believed that it is important that the Zn:S molar ratio is greater than 1 (e.g., the ratio is currently is 1.26). This results in a well-passivated surface with a positive Zn-amine interaction. However it is still possible to obtain positive results using other ratios of Zn:S.

In an embodiment, by varying the concentration of the reagents of Table 100, the number of slow injections the reagents are delivered in, the ratios of reagents within those slow injections, and the temperature at which the reaction is allowed to proceed, the following material properties may be altered to improve material performance: (1) the thickness of the ZnS shell formed around the quantum dot particle, (2) the ratio of Zn to S in the final ZnS coating, (3) the amount of the third coating which is alloyed, and (4) the final aspect ratio of particle. Thus, the delivery, total amounts, and relative ratios of any of the aforementioned reagents can be altered in order to affect the final properties of the product.

In an embodiment, in addition to making changes with the current reagents, other changes can also be explored. For example, other embodiments involve the use of alternate reagents, including alternate sulfur sources, such as elemental sulfur complexed with trioctylphosphine (S:TOP) and elemental sulfur complexed with oleylamine (S:OLAM). Alternate amines or mixtures of different types of amines can be used in other embodiments. Alternate reaction temperatures and alternate delivery rates of reagents can be used in other embodiments. Alternate delivery sequences, for example dividing the current one-injection reaction into a two-injection reaction, can be used in other embodiments. Addition of diols or other water-generating species in order to speed up reaction rates can be used in other embodiments. Changing the amount of TOPO such that the overall concentration of the key reagents change can be implemented in other embodiments.

In a specific embodiment, a synthetic procedure for providing a ZnS coating around CdSe/CdS seeded rod quantum dots involves the following preparations: (1) having the following reagents available: (a) trioctylphosphine oxide 99% CAS: 78-50-2 Sigma: 223301, (b) oleylamine, technical grade, Sigma Aldrich, (c) bis(trimethylsilyl) sulfide, >95%, TCI America, (d) diethylzinc, Sigma Aldrich; (e) CdSe/CdS seeded rod quantum dots, (f) 2-propanol ACS CAS: 67-63-0 Grade SAFC: 190764-20L, (g) methanol ACS CAS: 67-56-1 Grade 99.8% Sigma: 179337, (h) cyclohexane CAS: 110-82-7 Sigma: 650455-4x4L; and (2) having the following equipment available: (a) condenser CONDENSER LEIBIG 14/20 VWR:80067-398 (1), (b) Stir bar Egg shape VWR: 589449-006(1), (c) 50 mL, 3-neck, round bottom flask Chemglass 14/20 (1), (d) White rubber stopper VWR: 89097-554 (1); Vacuum grease (Apiezon H), (e) heating mantle, 50 mL, 80W VWR: 33787-040 (1), (f) stir plate 7X7 CER STIRRER 120V, VWR: 97042-626, (g) JKEM PID Temperature Control Unit (210-T. Model 210), (h) Omega Thermocouple Probe J-Type: Product ID: TJ36-IC316SS-18G-6, (i) T-joint replacement valve—special Chemglass p/no—part custom made for PLT, (j) Schlenk line/Vacuum Line, (k) liquid N2 (airgas), (l) Glass wool, (m) Syringe Pump similar to HA model 22, (n) 3 mL plastic Luer-Lock syringe, (o) 22 gauge, 4" luer-lock needles, (p) 500 µL air-tight glass syringe with minimum 50 µL graduations.

In an embodiment, preparation of quantum dots and TOPO in the reaction flask is first performed. The procedure then involves transfer of the rods (quantum dots) into the flask. The procedure then involves evaporation of the solvent from the quantum dot stock with flowing Argon. When the solvent has evaporated (from visual assessment), the procedure then involves turning off the flowing Argon. The procedure then involves removing the flask from the Schlenk line and transporting it to the designated weigh station (e.g., inside an HPE filtered work-station). The procedure then involves placing the flask/stir-bar (sitting on top of a small diameter cork ring) on an analytical microbalance and taring the microbalance. The procedure then involves transferring a stir bar (VWR Cat. No. 58949-006; Eggshaped ¾" by ⅜" disposable spinbar) into the flask. The procedure then involves transferring 13.5 g of TOPO into the flask. TOPO (solid) is stored, and can be weighed, outside of the glovebox in a light-duty, HEPA-filtered work-station. The procedure then involves assembling the reaction flask on the Schlenk line. The procedure then involves leaving the flask under static argon while working in the glovebox to prepare the injection solutions.

Regarding preparation of injection solutions inside of the glovebox, the procedure involves preparing a mixture of dimethylzinc and dimethylcamidum in the carrier solvent tributylphosphine inside the glovebox by first transferring 1.1394 g of tributylphosphine (TBP) to a 4 mL vial. The procedure then involves transferring 95.64 μL diethlyzinc into the TBP. The procedure then involves adding 19.76 μL dimethylcadmium into the TBP/DEZN mixture. The procedure then involves securely sealing the vial with a septa-cap. The procedure then involves mixing the solution by gently swirling (but not inverting) the vial. The procedure then involves transferring an adequate amount of bis(trmethylsilyl)sulfide ($(TMS)_2S$) liquid into a new, septa cap-sealed 4 mL vial. The procedure then involves transferring the pre-weighed 1.098 g oleylamine into a new, septa cap-sealed 4 mL vial. The procedure then involves, in secondary containment, transferring the injection solution, $(TMS)_2S$, and oleylamine outside of the glovebox and into the fume hood where the reaction is taking place.

Regarding the reaction, it should be noted that only the main trap needs to be submerged in liquid nitrogen. Also, glass wool can be used as insulation for the flask during all stages of the reaction. This is especially important depending on the heating mantle in use. If the solution level is above that of the heating mantle, it is preferred to use glass wool or insulating material when attempting to achieve and maintain temperatures above 120 C. Additionally, the TOPO should begin melting around 40-50 C and be completely melted above 60 C. The procedure then involves, when the reaction mixture becomes liquid enough for the stir bar to function, beginning stirring at 200 RPM to completely distribute the quantum dots in the TOPO. The procedure then involves, when the reaction mixture appears to be completely melted, beginning stirring at 800 RPM. The procedure then involves stirring the reaction mixture at 800 RPM for the remainder of the synthesis.

The procedure then involves, when the temperature equilibrates at around 120 C, de-gassing the reaction mixture for a standard time of 30 minutes. The procedure then involves slowly exposing the reaction the vacuum to prevent bumping or excessive bubbling of the reaction mixture. The procedure then involves, after the reaction de-gas period, switching the reaction back to flowing UHP Argon gas. The procedure then involves changing the temperature set-point of the reaction to 160 C. The procedure then involves raising the temperature of the reaction to 160 C by changing PID controller temperature set point to 160 C. The procedure then involves, when the temperature reaches 160 C, injecting the oleylamine into the reaction flask (e.g., using standard air-free injection techniques). The procedure then involves, when the reaction mixture recovers to 160 C, injecting 135 μL $(TMS)_2S$ using standard air-free injection techniques. The procedure then involves utilizing the glass, air-tight syringe for this operation. The procedure then involves, as soon as possible after the injection of the $(TMS)_2S$, beginning slowly injecting the TBP/DEZN/DMCD mixture at a rate of 10 μL per minute. Specifically, the injection 'begins' when the first drop of the TBP mixture hits the reaction solution. Note that this often requires starting the syringe pump a minute or so prior to the injection of the sulfur. The procedure then involves allowing the reaction to proceed. The procedure then involves, after the injection is complete, removing the needle from the reaction vessel, making a point to push out any remaining injection solution. The procedure then involves removing glass wool and reset Temp Set point to 100 C. The procedure then involves allowing the reaction to slowly cool to T<110 C. The procedure then involves, when T<80 C, briefly exposing the reaction to air and injecting 16.2 g of cyclohexane. The procedure then involves recovering the reaction and allowing the reaction to continue stirring until T is <25 C.

Figure 2B:
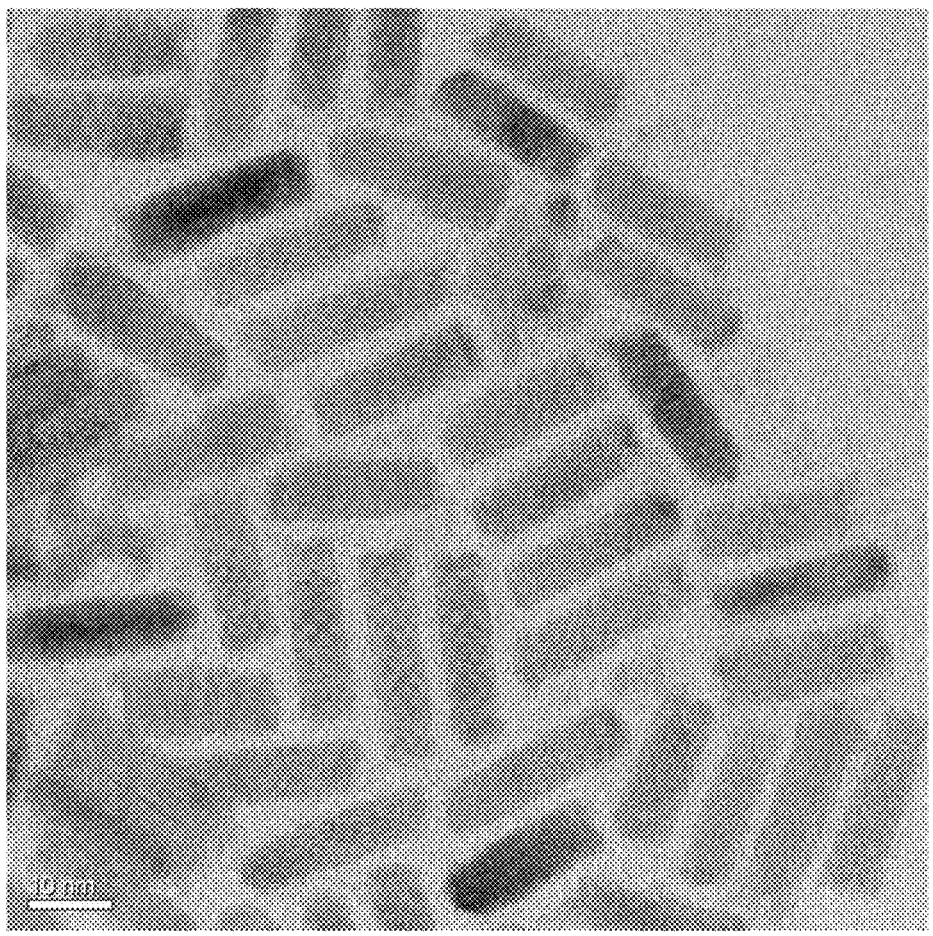
FIG. 2B is a TEM image of the seeded rods of the image of FIG. 2A with a further ZnS coating formed thereon, in accordance with an embodiment of the present invention.

The structural features of the beginning and then subsequently coated quantum dots can be observed through transmission electron microscope (TEM) images. In a first example, FIG. 2A is a TEM image 200A of seeded rods (CdSe/CdS pairings), the ends of which are at least somewhat rounded. FIG. 2B is a TEM image 200B of the seeded rods of image 200A with a further ZnS coating formed thereon, in accordance with an embodiment of the present invention. Referring to image 200B, the ends can be viewed as being squared-off with the coating, even though the ends of the seeded rod structure were somewhat rounded.

Figure 3A:
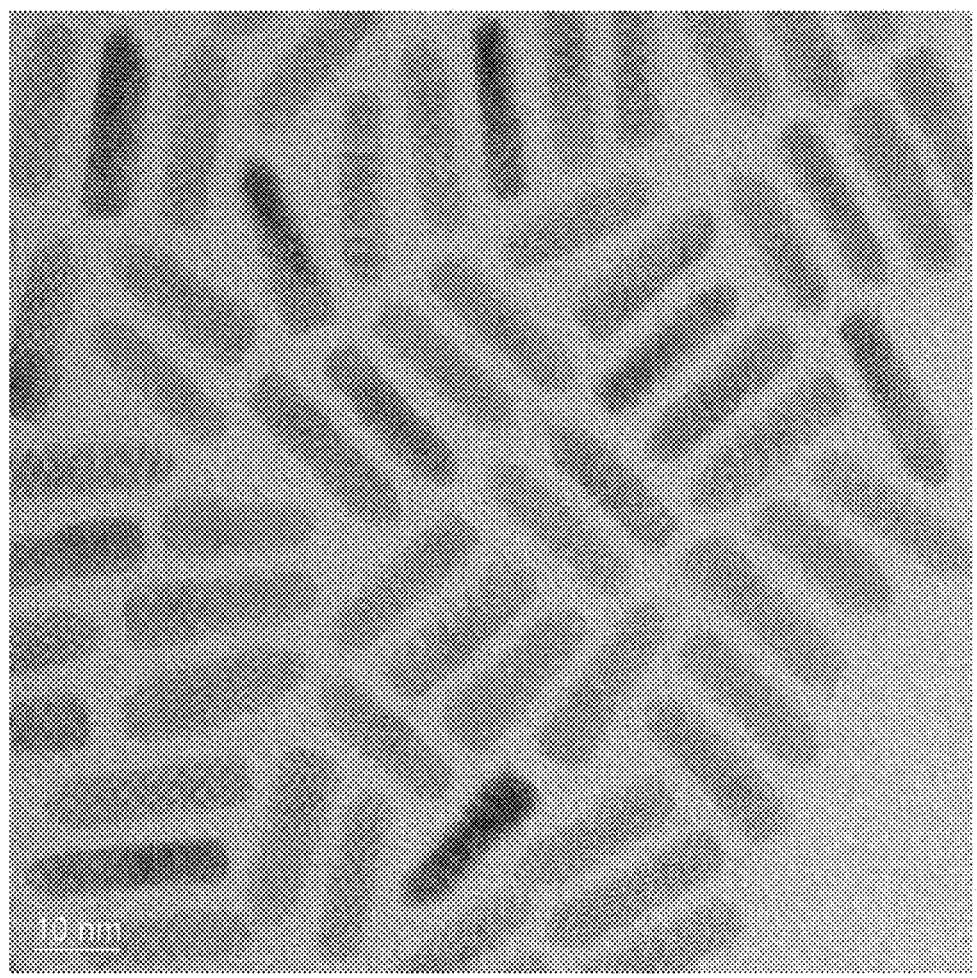
FIG. 3A is a TEM image of seeded rods (CdSe/CdS pairings), the ends of which are at least somewhat rounded.
Figure 3B:
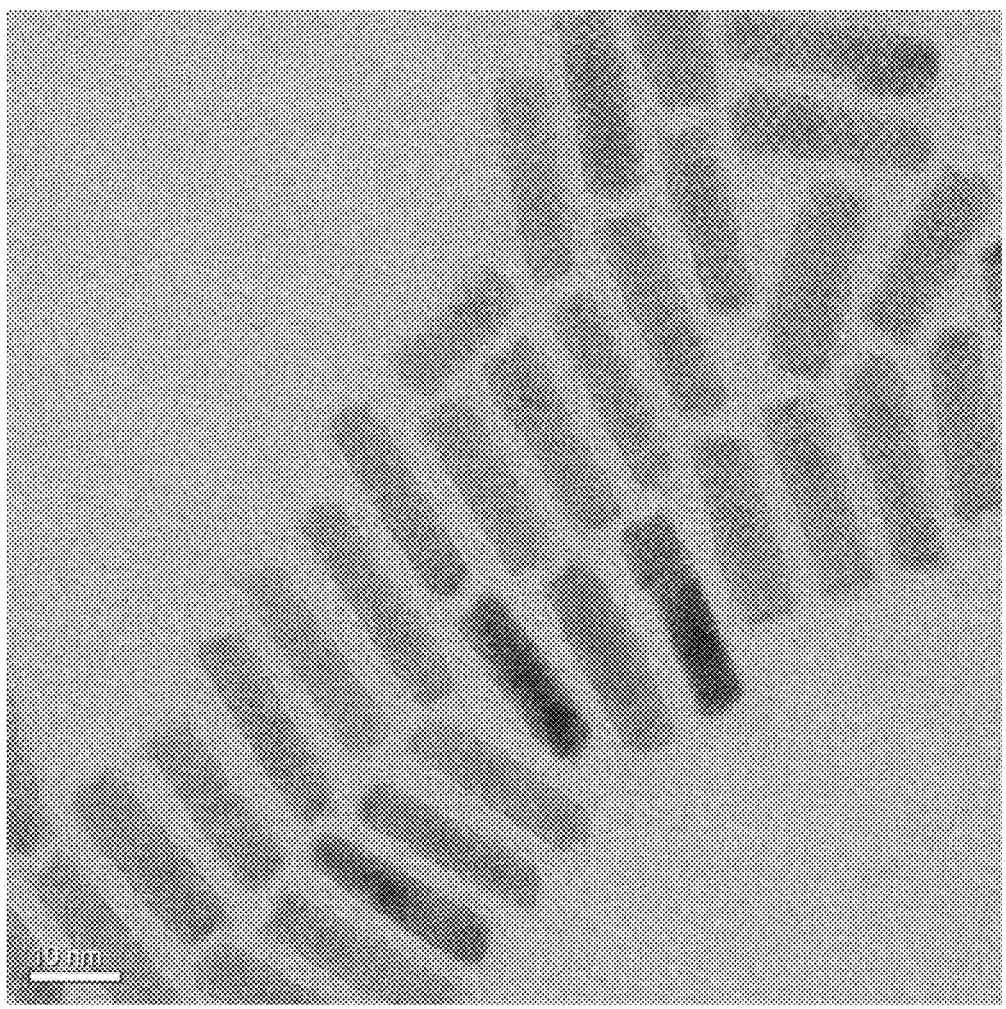
FIG. 3B is a TEM image of the seeded rods of the image of FIG. 3A with a further ZnS coating formed thereon, in accordance with an embodiment of the present invention.
Figure 3C:
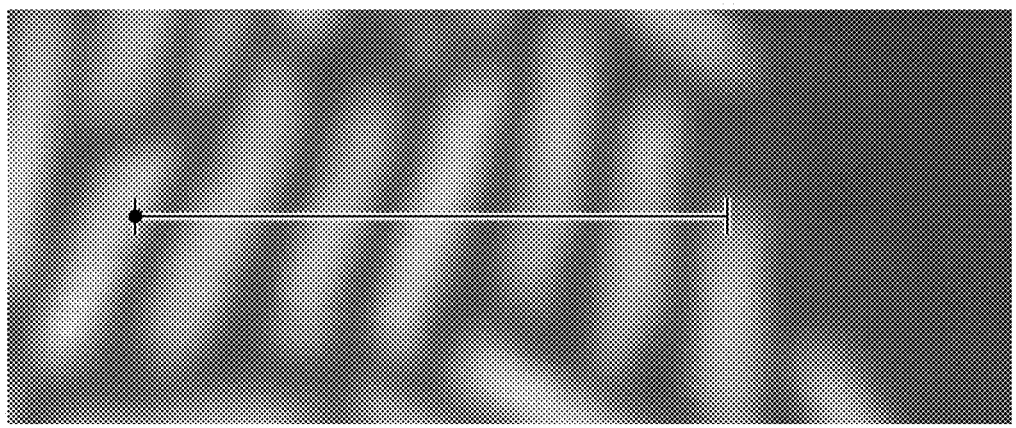
FIG. 3C is a TEM line scan and resulting elemental analysis of a seeded rod coated with ZnS such as those shown in FIG. 3B, in accordance with an embodiment of the present invention.
Figure 3C:
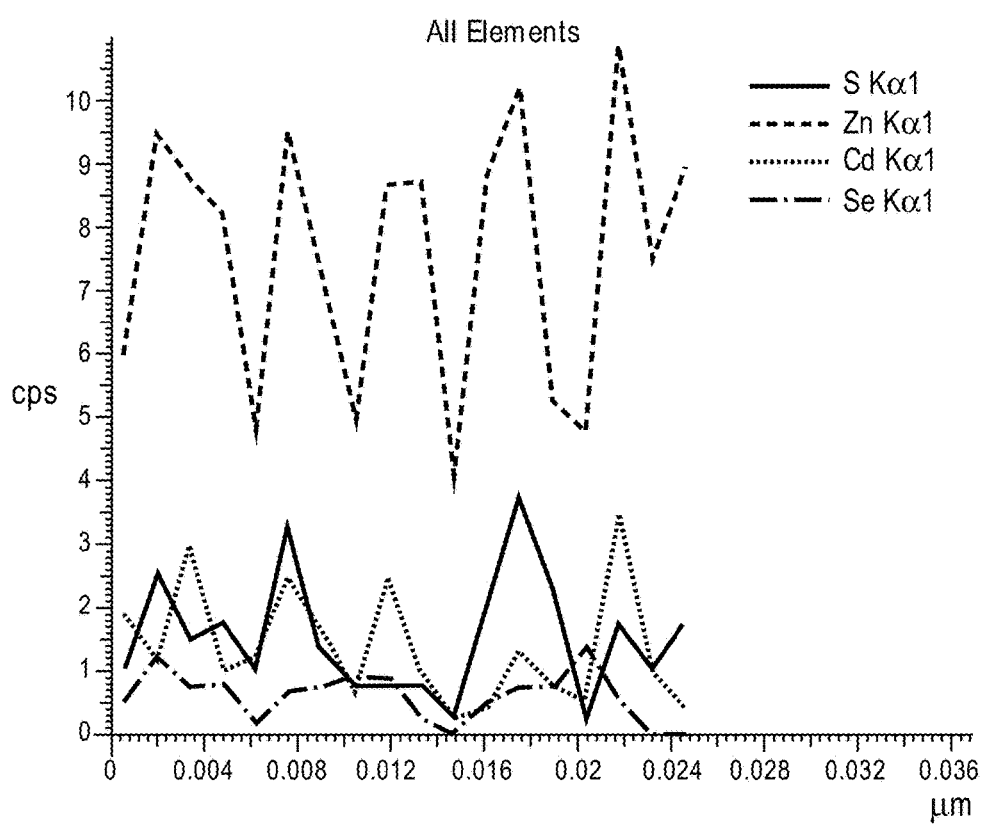

In a second example, FIG. 3A is a TEM image 300A of seeded rods (CdSe/CdS pairings), the ends of which are at least somewhat rounded. FIG. 3B is a TEM image 300B of the seeded rods of image 300A with a further ZnS coating formed thereon, in accordance with an embodiment of the present invention. Referring to image 300B, the ends can be viewed as being squared-off with the coating, even though the ends of the seeded rod structure were somewhat rounded. FIG. 3C is a TEM line scan 350 and resulting elemental analysis 360 of a seeded rod coated with ZnS such as those shown in FIG. 3B, in accordance with an embodiment of the present invention. The magnitude of the lines in 360 indicates the relative amount of element detected along the line scan 350. Since the line is crossing multiple quantum dots the magnitudes rise and fall as quantum dots are crossed. The presence of the Zn element is significant and follows the physical placement of the quantum dots. Thus, the analysis of elements along the line shows that the seeded rods are composed of CdSe/CdS are further coated by a layer of ZnS.

Figure 4A:
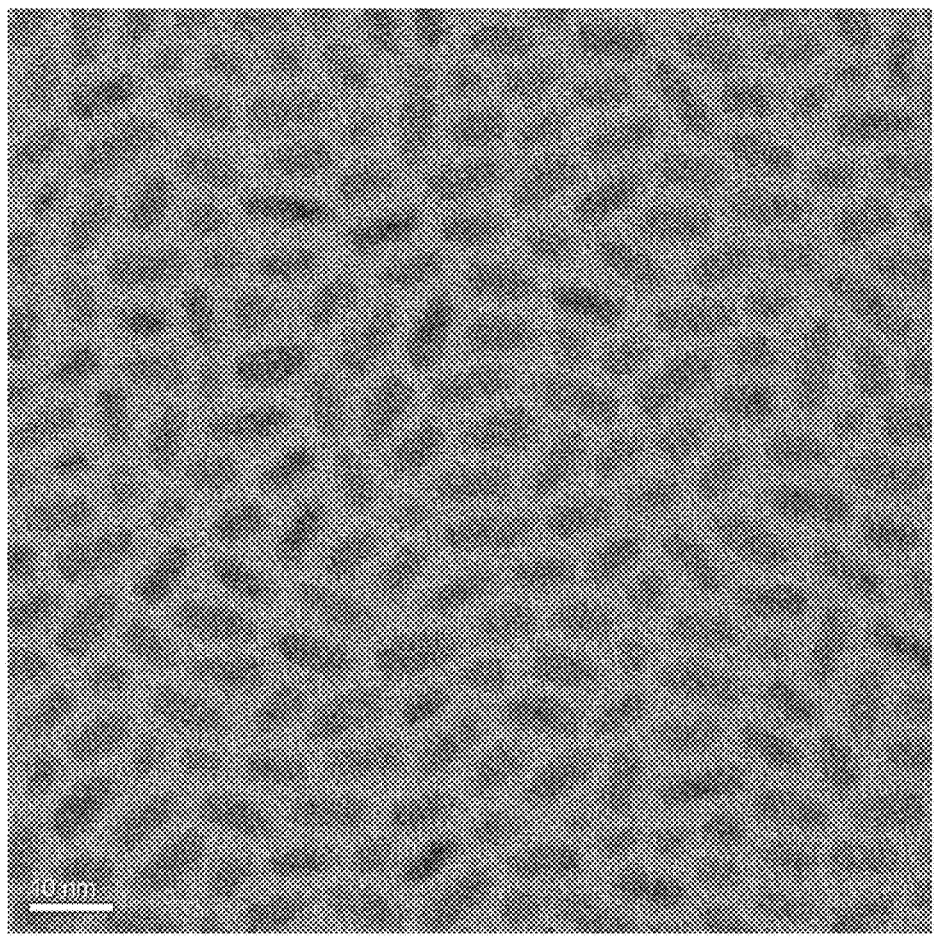
FIG. 4A is a TEM image of green-emitting rods, the ends of which are at least somewhat rounded.
Figure 4B:
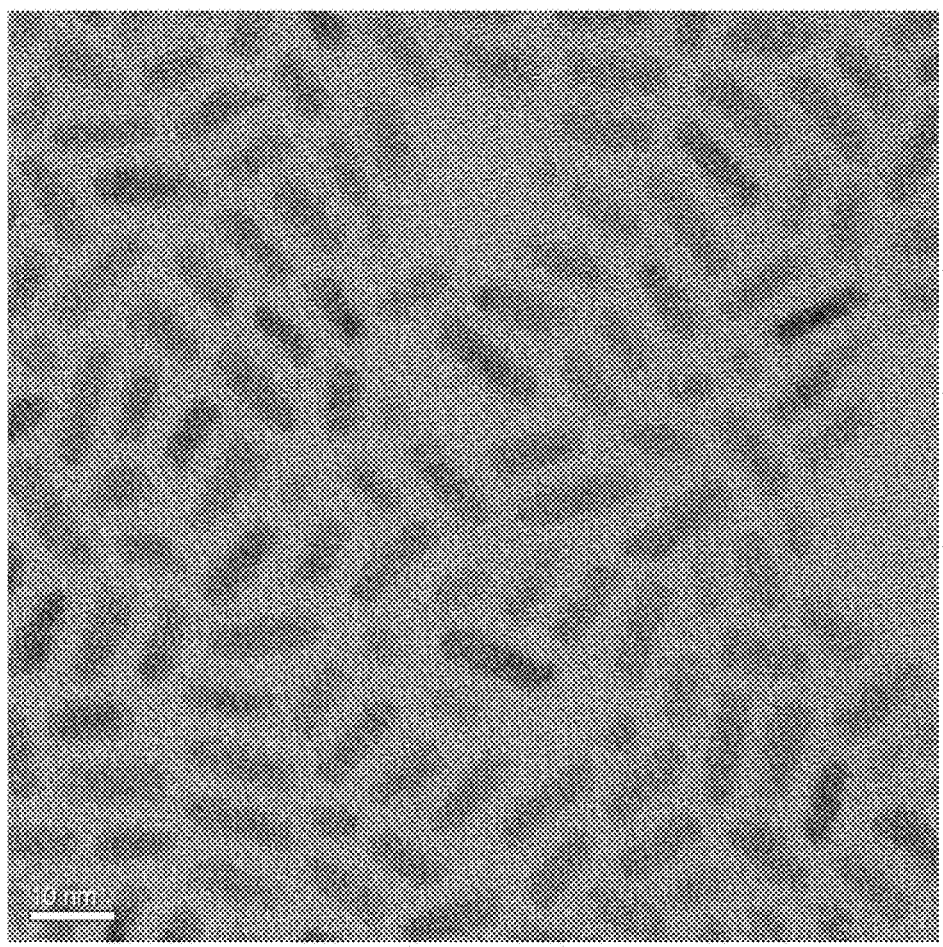
FIG. 4B is a TEM image of the green-emitting rods of the image of FIG. 4A with a further ZnS coating formed thereon, in accordance with an embodiment of the present invention.

In a third example, FIG. 4A is a TEM image 400A of green rods, the ends of which are at least somewhat rounded. FIG. 4B is a TEM image 400B of the seeded rods of image 400A with a further ZnS coating formed thereon, in accordance with an embodiment of the present invention. Referring to image 400B, the ends can be viewed as being squared-off with the coating, even though the ends of the seeded rod structure were somewhat rounded.

Figure 5A:
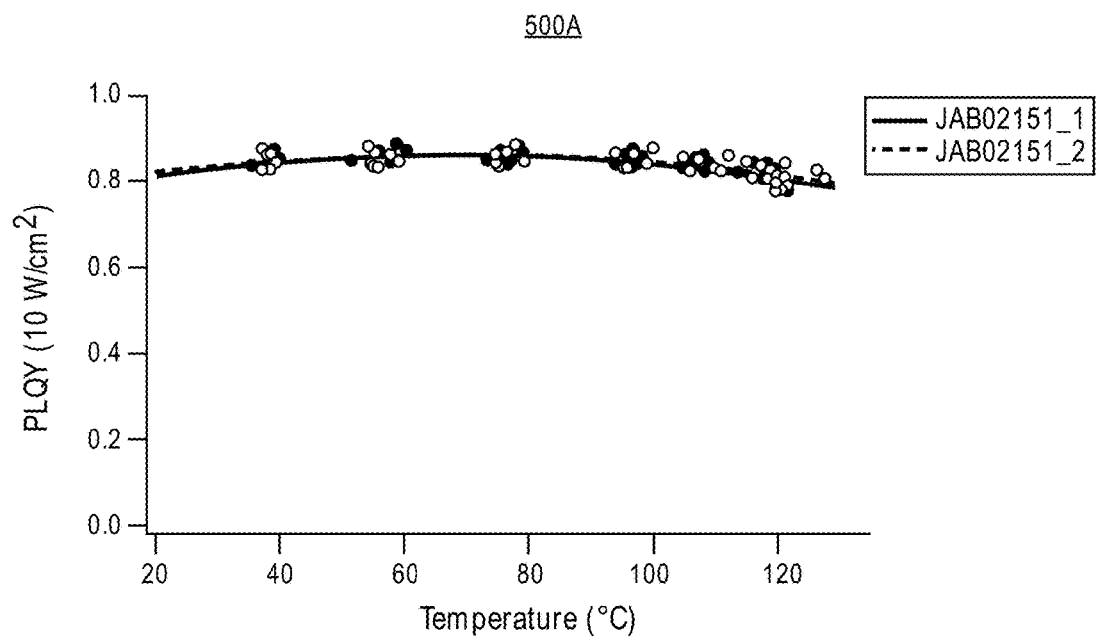
FIGS. 5A and 5B include plots which reveal temperature curves showing measurement of the photoluminescence of quantum dots as a function of temperature in a silicone film at 10 W/cm$^2$, in accordance with an embodiment of the present invention.
Figure 5B:
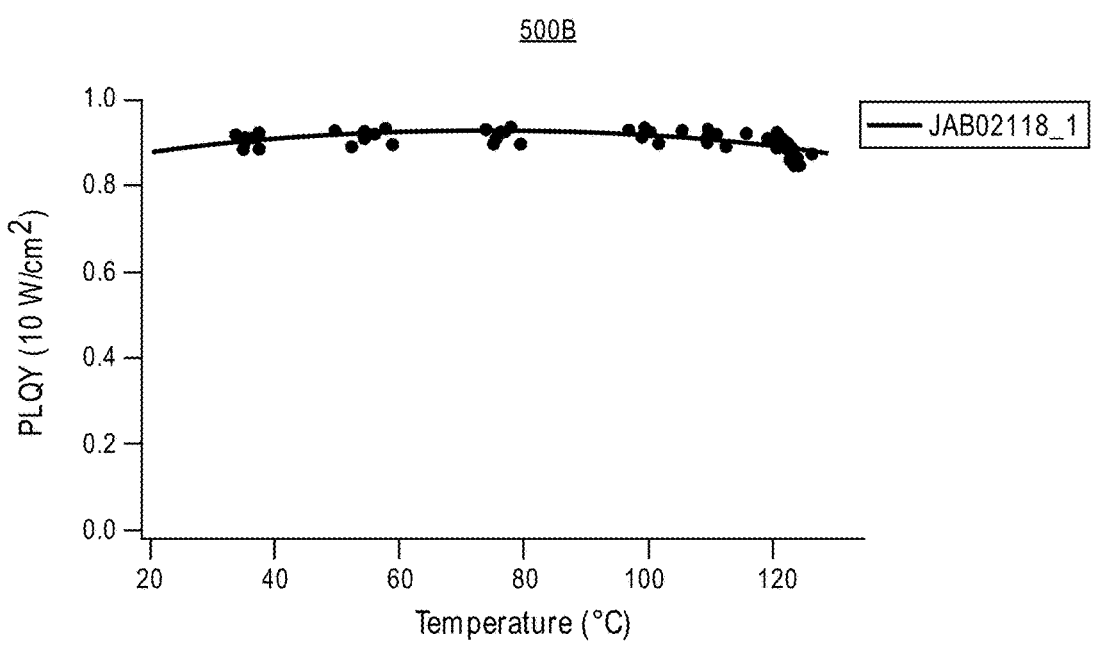
Figure 6:
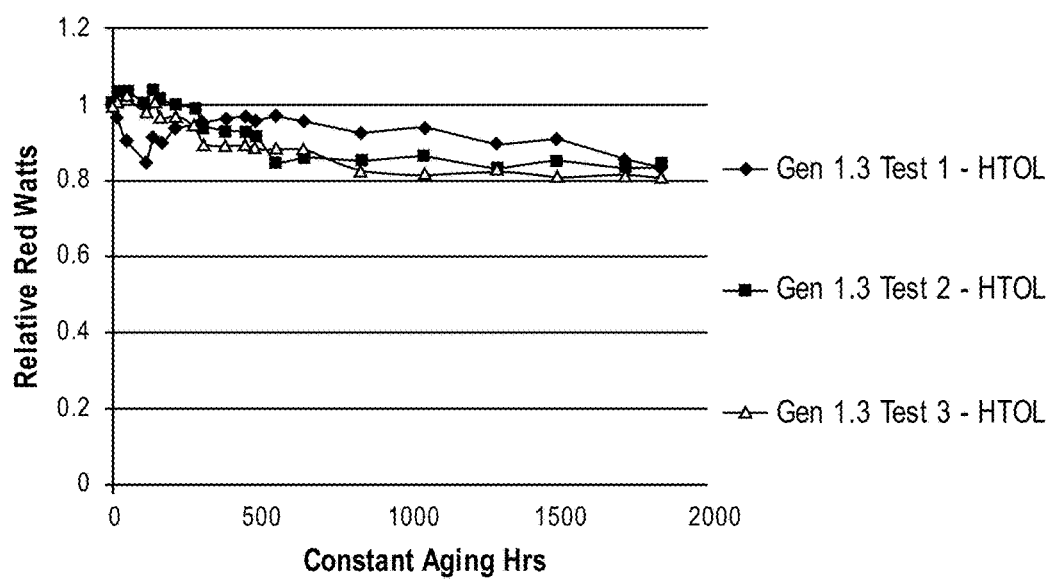
FIG. 6 includes a plot revealing on-chip red emission as a function of aging hours, in accordance with an embodiment of the present invention.

FIGS. 5A and 5B include plots 500A and 500B, respectively, which reveal temperature curves showing measurement of the photoluminescence of quantum dots as a function of temperature in a silicone film at 10 $W/cm^2$, in accordance with an embodiment of the present invention. FIG. 6 includes a plot 600 revealing on-chip red emission as a function of aging hours, in accordance with an embodiment of the present invention. Referring to plots 500A, 500B and 600, stability of the ZnS coated quantum dots with respect to flux and aging is very pronounced.

As described above, hetero-structure-based quantum dots may have a third semiconductor coating with squared-off ends formed thereon. It is to be appreciated that the resulting structure having a third semiconductor layer thereon may also be referred to as a quantum dot heterostructure (QDH). For instances when description is intended to exclude the outer coating, a hetero-structures may be referred to as a nano-crystalline core and nano-crystalline shell pairing. The nano-crystalline core and nano-crystalline shell pairing may have specific geometries suitable for performance optimization. In an example, several factors may be intertwined for establishing an optimized geometry for a quantum dot having a nano-crystalline core and nano-crystalline shell pairing. As a reference, FIG. 7 illustrates a schematic of a cross-sectional view of a nano-crystalline core and nano-crystalline shell pairing with a crystalline semiconductor layer having a geometry with squared-off ends formed thereon, in accordance with an embodiment of the present invention.

Figure 7:
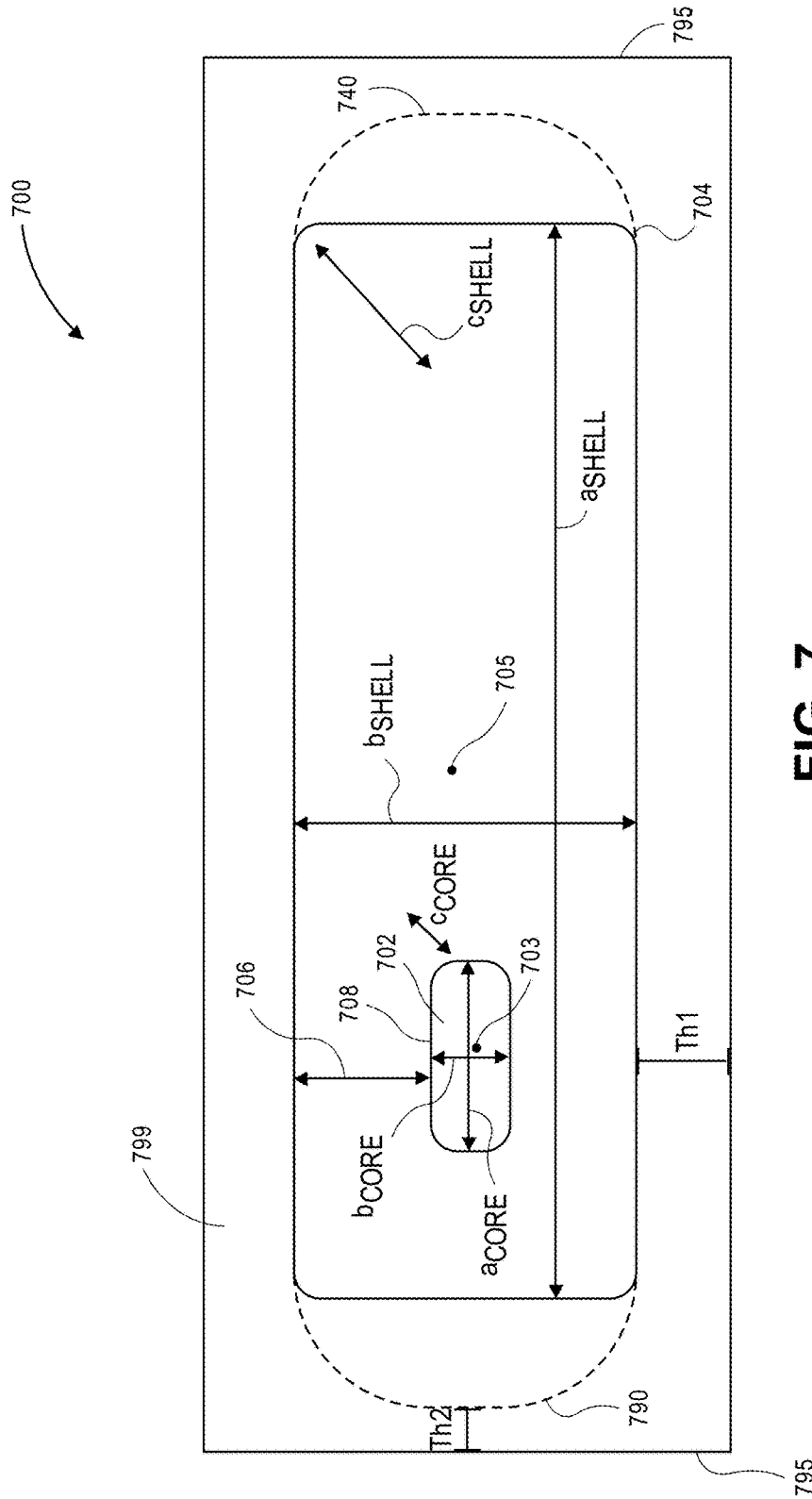
FIG. 7 illustrates a schematic of a cross-sectional view of a nano-crystalline core and nano-crystalline shell pairing with a crystalline semiconductor layer having a geometry with squared-off ends formed thereon, in accordance with an embodiment of the present invention.

Referring to FIG. 7, a semiconductor structure (e.g., a quantum dot structure) 700 includes a nano-crystalline core 702 surrounded by a nano-crystalline shell 704. The nano-crystalline core 702 has a length axis ($a_{CORE}$), a width axis ($b_{CORE}$) and a depth axis ($c_{CORE}$), the depth axis provided into and out of the plane shown in FIG. 7. Likewise, the nano-crystalline shell 704 has a length axis ($a_{SHELL}$), a width axis ($b_{SHELL}$) and a depth axis ($c_{SHELL}$), the depth axis provided into and out of the plane shown in FIG. 7. The nano-crystalline core 702 has a center 703 and the nano-crystalline shell 704 has a center 705. The nano-crystalline shell 704 surrounds the nano-crystalline core 702 in the b-axis direction by an amount 706, as is also depicted in FIG. 7.

In addition to material composition, the following are attributes of a quantum dot that may be tuned for optimization, with reference to the parameters provided in FIG. 7, in accordance with embodiments of the present invention. Nano-crystalline core 702 diameter (a, b or c) and aspect ratio (e.g., a/b) can be controlled for rough tuning for emission wavelength. A smaller overall nano-crystalline core provides a greater surface to volume ratio. The width of the nano-crystalline shell along 706 may be tuned for yield optimization and quantum confinement providing approaches to control red-shifting and mitigation of surface effects. However, strain considerations must be accounted for when optimizing the value of thickness 706. The length ($a_{SHELL}$) of the shell is tunable to provide longer radiative decay times as well as increased light absorption. The overall aspect ratio of the structure 700 (e.g., the greater of $a_{SHELL}/b_{SHELL}$ and $a_{SHELL}/c_{SHELL}$) may be tuned to directly impact PLQY. Meanwhile, overall surface/volume ratio for 700 may be kept relatively smaller to provide lower surface defects, provide higher photoluminescence, and limit self-absorption. Referring again to FIG. 7, the shell/core interface 708 may be tailored to avoid dislocations and strain sites. In one such embodiment, a high quality interface is obtained by tailoring one or more of injection temperature and mixing parameters, the use of surfactants, and control of the reactivity of precursors. The interface may also be alloyed to relieve strain.

In accordance with an embodiment of the present invention, a high PLQY quantum dot is based on a core/shell pairing using an anisotropic core. With reference again to FIG. 7, an anisotropic core is a core having one of the axes $a_{CORE}$, $b_{CORE}$ or $c_{CORE}$ different from one or both of the remaining axes. An aspect ratio of such an anisotropic core is determined by the longest of the axes $a_{CORE}$, $b_{CORE}$ or $c_{CORE}$ divided by the shortest of the axes $a_{CORE}$, $b_{CORE}$ or $c_{CORE}$ to provide a number greater than 1 (an isotropic core has an aspect ratio of 1). It is to be understood that the outer surface of an anisotropic core may have rounded or curved edges (e.g., as in an ellipsoid) or may be faceted (e.g., as in a stretched or elongated tetragonal or hexagonal prism) to provide an aspect ratio of greater than 1 (note that a sphere, a tetragonal prism, and a hexagonal prism are all considered to have an aspect ratio of 1 in keeping with embodiments of the present invention).

A workable range of aspect ratio for an anisotropic nano-crystalline core for a quantum dot may be selected for maximization of PLQY. For example, a core that is essentially isotropic may not provide advantages for increasing PLQY, while a core with too great an aspect ratio (e.g., 2 or greater) may present challenges synthetically and geometrically when forming a surrounding shell. Furthermore, embedding the core in a shell composed of a material different than the core may also be used enhance PLQY of a resulting quantum dot.

Accordingly, in an embodiment, a semiconductor structure includes an anisotropic nano-crystalline core composed of a first semiconductor material and having an aspect ratio between, but not including, 1.0 and 2.0. The semiconductor structure also includes a nano-crystalline shell composed of a second, different, semiconductor material at least partially surrounding the anisotropic nano-crystalline core. In one such embodiment, the aspect ratio of the anisotropic nano-crystalline core is approximately in the range of 1.01-1.2 and, in a particular embodiment, is approximately in the range of 1.1-1.2. In the case of rounded edges, then, the nano-crystalline core may be substantially, but not perfectly, spherical. However, the nano-crystalline core may instead be faceted. In an embodiment, the anisotropic nano-crystalline core is disposed in an asymmetric orientation with respect to the nano-crystalline shell, as described in greater detail in the example below. In other embodiments, however, the anisotropic nano-crystalline core is disposed in an on-axis (centered) with respect to the nano-crystalline shell.

Another consideration for maximization of PLQY in a quantum dot structure is to provide an asymmetric orientation of the core within a surrounding shell. For example, referring again to FIG. 7, the center 703 of the core 702 may be misaligned with (e.g., have a different spatial point than) the center 705 of the shell 704. In an embodiment, a semiconductor structure includes an anisotropic nano-crystalline core composed of a first semiconductor material. The semiconductor structure also includes a nano-crystalline shell composed of a second, different, semiconductor material at least partially surrounding the anisotropic nano-crystalline core. The anisotropic nano-crystalline core is disposed in an asymmetric orientation with respect to the nano-crystalline shell. In one such embodiment, the nano-crystalline shell has a long axis (e.g., $a_{SHELL}$), and the anisotropic nano-crystalline core is disposed off-center along the long axis. In another such embodiment, the nano-crystalline shell has a short axis (e.g., $b_{SHELL}$), and the anisotropic nano-crystalline core is disposed off-center along the short axis. In yet another embodiment, however, the nano-crystalline shell has a long axis (e.g., $a_{SHELL}$) and a short axis (e.g., $b_{SHELL}$), and the anisotropic nano-crystalline core is disposed off-center along both the long and short axes.

With reference to the above described nano-crystalline core and nano-crystalline shell pairings, in an embodiment, the nano-crystalline shell completely surrounds the anisotropic nano-crystalline core. In an alternative embodiment, however, the nano-crystalline shell only partially surrounds the anisotropic nano-crystalline core, exposing a portion of the anisotropic nano-crystalline core, e.g., as in a tetrapod geometry or arrangement. In an embodiment, the nano-crystalline shell is an anisotropic nano-crystalline shell, such as a nano-rod, that surrounds the anisotropic nano-crystalline core at an interface between the anisotropic nano-crystalline shell and the anisotropic nano-crystalline core. The anisotropic nano-crystalline shell passivates or reduces trap states at the interface. The anisotropic nano-crystalline shell may also, or instead, deactivate trap states at the interface.

With reference again to the above described nano-crystalline core and nano-crystalline shell pairings, in an embodiment, the first and second semiconductor materials (core and shell, respectively) are each materials such as, but not limited to, Group II-VI materials (where the group II species could include species from Groups II (e.g., magnesium) or XII of the periodic table), Group III-V materials, Group IV-VI materials, Group materials, or Group II-IV-VI materials and, in one embodiment, are mono-crystalline. In one such embodiment, the first and second semiconductor materials are both Group II-VI materials, the first semiconductor material is cadmium selenide (CdSe), and the second semiconductor material is one such as, but not limited to, cadmium sulfide (CdS), zinc sulfide (ZnS), or zinc selenide (ZnSe).

With reference again to the above described nano-crystalline core and nano-crystalline shell pairings, in an embodiment, the semiconductor structure (i.e., the core/shell pairing in total) has an aspect ratio approximately in the range of 1.5-10 and, 3-6 in a particular embodiment. In an embodiment, the nano-crystalline shell has a long axis and a short axis. The long axis has a length approximately in the range of 5-40 nanometers. The short axis has a length approximately in the range of 1-5 nanometers greater than a diameter of the anisotropic nano-crystalline core parallel with the short axis of the nano-crystalline shell. In a specific such embodiment, the anisotropic nano-crystalline core has a diameter approximately in the range of 2-5 nanometers. The thickness of the nano-crystalline shell on the anisotropic nano-crystalline core along a short axis of the nano-crystalline shell is approximately in the range of 1-5 nanometers of the second semiconductor material.

With reference again to the above described nano-crystalline core and nano-crystalline shell pairings, in an embodiment, the anisotropic nano-crystalline core and the nano-crystalline shell form a quantum dot. In one such embodiment, the quantum dot has a photoluminescence quantum yield (PLQY) of at least 90%. Emission from the quantum dot may be mostly, or entirely, from the nano-crystalline core. For example, in an embodiment, emission from the anisotropic nano-crystalline core is at least approximately 75% of the total emission from the quantum dot. An absorption spectrum and an emission spectrum of the quantum dot may be essentially non-overlapping. For example, in an embodiment, an absorbance ratio of the quantum dot based on absorbance at 400 nanometers versus absorbance at an exciton peak for the quantum dot is approximately in the range of 5-35.

Referring again to FIG. 7, in accordance with an embodiment of the present invention, the semiconductor structure further includes a crystalline semiconductor coating 799 completely surrounding the nano-crystalline shell 704. The crystalline semiconductor coating 799 is composed of a third semiconductor material different from the first and second semiconductor materials. In a particular such embodiment, the first semiconductor material is cadmium selenide (CdSe), the second semiconductor material is cadmium sulfide (CdS), and the third semiconductor material is zinc sulfide (ZnS). In one such embodiment, the ZnS layer may include a minority portion of cadmium (e.g., substantially less cadmium than Zn) and be referred to as a ZnS coating. In other embodiments, however, the third semiconductor material is the same as one of the first and second semiconductor materials. Additionally, it is to be appreciated that in more general embodiments, such a semiconductor coating 799 can be added to any suitable core shells including quantum dots having three or more layers.

Thus, in an embodiment, a semiconductor structure includes a quantum dot structure 702/704 having an outermost surface. A crystalline semiconductor coating 799 is disposed on and completely surrounds the outermost surface of the quantum dot structure 702/704. The crystalline semiconductor coating 799 has a geometry with squared-off ends 795. In one such embodiment, the quantum dot structure 702/704 is a rod-shaped structure having a long axis (aSHELL). The squared-off ends 795 of the crystalline semiconductor coating 799 are aligned with respective ends (e.g., 740/790) of the long axis of the quantum dot structure 702/704. In a particular embodiment, as described above, respective ends 740/790 of the long axis of the quantum dot structure are rounded ends even though the squared-off ends 795 have a substantially flat surface, as is depicted in FIG. 7. In an embodiment, the quantum dot 702/704 is a core 702 and shell 704 pairing, as is also depicted in FIG. 7.

In an embodiment, as is also described above, the crystalline semiconductor coating 799 has differing thicknesses along differing sides of the quantum dot structure 702/704. For example, in one embodiment, the thickness Th1 of the crystalline semiconductor coating 799 along the long sides of the quantum dot structure 702/704 (i.e., the ends at the short axis) is greater than the thickness Th2 of the crystalline semiconductor coating 799 along the short sides (e.g., along curved portions 740/790) of the quantum dot structure 702/704 (i.e., the ends at the long axis axis). In another embodiment, the thickness Th1 of the crystalline semiconductor coating 799 along the long sides of the quantum dot structure 702/704 (i.e., the ends at the short axis) is less than the thickness Th2 of the crystalline semiconductor coating 799 along the short sides (e.g., along curved portions 740/790) of the quantum dot structure 702/704 (i.e., the ends at the long axis axis). In an alternative embodiment, the thickness Th1 of the crystalline semiconductor coating 799 along the long sides of the quantum dot structure 702/704 (i.e., the ends at the short axis) is the same as the thickness Th2 of the crystalline semiconductor coating 799 along the short sides (e.g., along curved portions 740/790) of the quantum dot structure 702/704 (i.e., the ends at the long axis axis). In one embodiment, Th1 is between 0 and 5 nanometers, and Th2 is between 0 and 10 nanometers.

It is also to be appreciated that the nano-crystalline shell 704 may be formed with or without alignment to a global center of the crystalline semiconductor coating 799. In one embodiment, then, the nano-crystalline shell 704 is formed centered to a global center of the crystalline semiconductor coating 799, as is depicted in FIG. 7. In another embodiment, however, the nano-crystalline shell 704 is formed off-set from a global center of the crystalline semiconductor coating 799.

In an embodiment, a quantum dot based on the above described nano-crystalline core and nano-crystalline shell pairings is a down-converting quantum dot. However, in an alternative embodiment, the quantum dot is an up-shifting quantum dot. In either case, a lighting apparatus may include a light emitting diode and a plurality of quantum dots such as those described above. The quantum dots may be applied proximal to the LED and provide down-shifting or up-shifting of light emitted from the LED. Thus, semiconductor structures according to the present invention may be advantageously used in solid state lighting. The visible spectrum includes light of different colors having wavelengths between about 380 nm and about 780 nm that are visible to the human eye. An LED will emit a UV or blue light which is down-converted (or up-shifted) by semiconductor structures described herein. Any suitable ratio of emission color from the semiconductor structures may be used in devices of the present invention. LED devices according to embodiments of the present invention may have incorporated therein sufficient quantity of semiconductor structures (e.g., quantum dots) described herein capable of down-converting any available blue light to red, green, yellow, orange, blue, indigo, violet or other color. These structures may also be used to downconvert or upconvert lower energy light (green, yellow, etc) from LED devices, as long as the excitation light produces emission from the structures.

Referring to FIGS. 2B, 3B, 4B and 7, although not depicted, the structure 700 may further include an insulator coating surrounding and encapsulating the quantum dots having the crystalline semiconductor coating with a geometry having squared-off ends thereon. In one such embodiment, the insulator coating is composed of an amorphous material such as, but not limited to, silica ($SiO_x$), titanium oxide ($TiO_x$), zirconium oxide ($ZrO_x$), alumina ($AlO_x$), or hafnia ($HfO_x$). In an embodiment, insulator-coated structures based on structure 700 are referred to in their entirety as quantum dot structures for convenience. For example, the resulting structures, with our without an insulator coating may be used as down-converting quantum dots or up-shifting quantum dots and are referred to accordingly.

Figure 8:
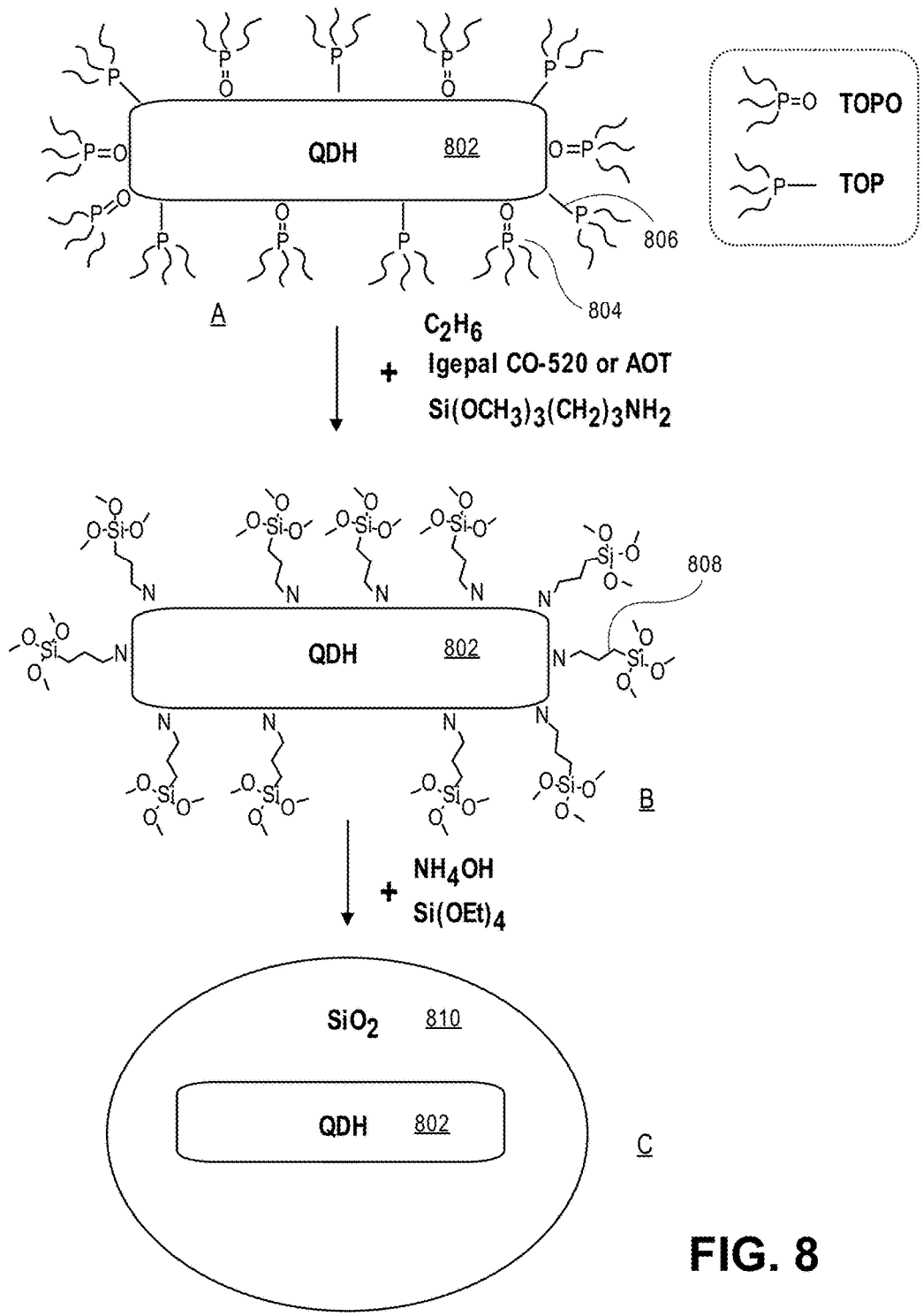
FIG. 8 illustrates operations in a reverse micelle approach to insulating a semiconductor structure having a semiconductor coating having a geometry with squared-off ends thereon, in accordance with an embodiment of the present invention.

The above described insulator coating may be formed to encapsulate a quantum dot using a reverse micelle process. For example, FIG. 8 illustrates operations in a reverse micelle approach to insulating a semiconductor structure (e.g., where the semiconductor structure is a quantum dot having a semiconductor coating having a geometry with squared-off ends thereon), in accordance with an embodiment of the present invention. Referring to part A of FIG. 8, a quantum dot hetero-structure (QDH) 802 (e.g., a nano-crystalline core/shell pairing having a semiconductor coating having a geometry with squared-off ends thereon) has attached thereto a plurality of TOPO ligands 804 and TOP ligands 806. It is to be appreciated that other approaches may work as well, such as surface ligand exchange. For example the ligand can be selected from phosphonic acids, oleic acids, etc., before the silica is added. Referring to part B, the plurality of TOPO ligands 804 and TOP ligands 806 are exchanged with a plurality of $Si(OCH_3)_3(CH_2)_3NH_2$ ligands 808. The structure of part B is then reacted with TEOS ($Si(OEt)_4$) and ammonium hydroxide ($NH_4OH$) to form a silica coating 810 surrounding the QDH 802, as depicted in part C of FIG. 8.

In another aspect, a polymer matrix composition is applied to a lighting device to provide a layer having a dispersion of semiconductor structures therein for inclusion in the lighting device. In one embodiment, the dispersion of semiconductor structures is a dispersion of quantum dots such as those described above in association with FIGS. 2B, 3B, 4B, 7 and 8.

In a first exemplary embodiment, a method of applying a light-conversion layer to a surface of a light-emitting diode (LED) includes first, separately, forming a polymer matrix from a mixture of quantum dots. The resulting polymer matrix includes a dispersion of the quantum dots therein and is then applied to the surface of the LED. In one such embodiment, applying the polymer matrix to the surface of the LED involves using a technique such as, but not limited to, spraying, dip-coating, spin-coating, or drop-casting. The polymer matrix can be cured with ultra-violet (UV) light exposure or heating, in one embodiment. It is to be appreciated that the polymer matrix having the dispersion of quantum dots therein can be applied to discrete LED devices or, in another embodiment, prior to dicing the LEDs from a wafer having a plurality of LED dies. In the latter case, application of the polymer matrix or matrix can involve uniform distribution across the wafer prior to dicing the wafer.

Figure 9:
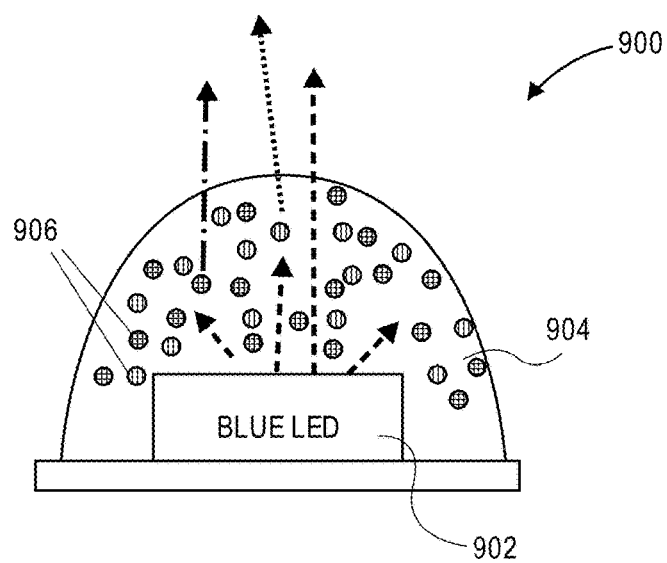
FIG. 9 illustrates a lighting device that includes a blue LED with a layer having a polymer matrix with a dispersion of quantum dots coated with a semiconductor coating having a geometry with squared-off ends therein, in accordance with an embodiment of the present invention.

With respect to illustrating the above concepts in a resulting device configuration, FIG. 9 illustrates a lighting device 900. Device 900 has a blue LED 902 with a polymer matrix layer 904 having a dispersion of quantum dots 906 coated with a semiconductor coating having a geometry with squared-off ends therein, in accordance with an embodiment of the present invention. Devices 900 may be used to produce "cold" or "warm" white light. In one embodiment, the device 900 has little to no wasted energy since there is little to no emission in the IR regime. In a specific such embodiment, the use of a polymer matrix layer having a composition with a dispersion of anisotropic quantum dots therein enables greater than approximately 40% lm/W gains versus the use of conventional phosphors. Increased efficacy may thus be achieved, meaning increased luminous efficacy based on lumens (perceived light brightness) per watt electrical power. Accordingly, down converter efficiency and spectral overlap may be improved with the use of a dispersion of quantum dots to achieve efficiency gains in lighting and display. In an additional embodiment, a conventional phosphor is also included in the polymer matrix composition, along with the dispersion of quantum dots 906.

Figure 10:
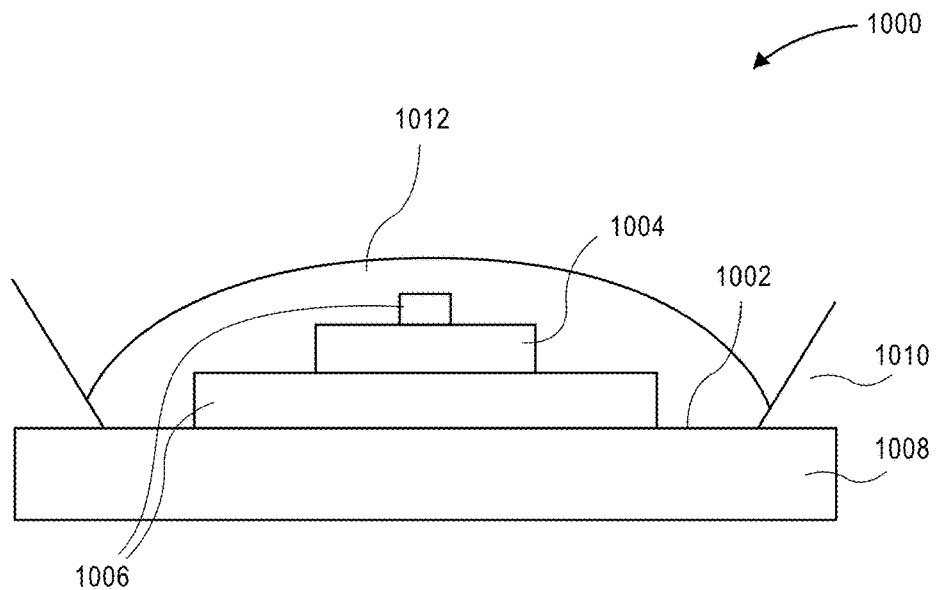
FIG. 10 illustrates a cross-sectional view of a lighting device with a layer having a polymer matrix with a dispersion of quantum dots coated with a semiconductor coating having a geometry with squared-off ends therein, in accordance with an embodiment of the present invention.

Different approaches may be used to provide a quantum dot layer in a lighting device. In an example, FIG. 10 illustrates a cross-sectional view of a lighting device 1000 with a layer having a polymer matrix composition with a dispersion of quantum dots coated with a semiconductor coating having a geometry with squared-off ends therein, in accordance with an embodiment of the present invention. Referring to FIG. 10, a blue LED structure 1002 includes a die 1004, such as an InGaN die, and electrodes 1006. The blue LED structure 1002 is disposed on a coating or supporting surface 1008 and housed within a protective and/or reflective structure 1010. A polymer matrix layer 1012 is formed over the blue LED structure 1002 and within the protective and/or reflective structure 1010. The polymer matrix layer 1012 has a composition including a dispersion of quantum dots or a combination of a dispersion of quantum dots and conventional phosphors. Although not depicted, the protective and/or reflective structure 1010 can be extended upwards, well above the matrix layer 1012, to provide a "cup" configuration.

Figure 11:
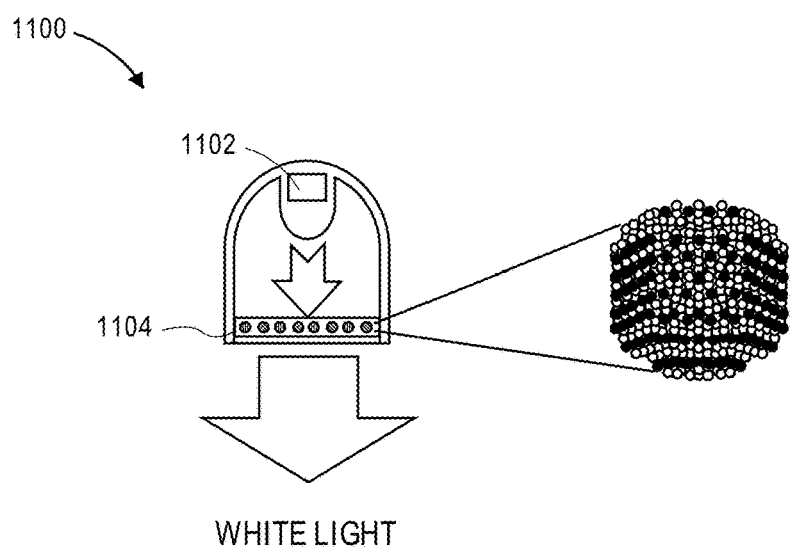
FIG. 11 illustrates a cross-sectional view of a lighting device with a layer having a polymer matrix with a dispersion of quantum dots coated with a semiconductor coating having a geometry with squared-off ends therein, in accordance with another embodiment of the present invention.

Although described herein as applicable for on-chip applications, polymer matrix compositions may also be used as remote layers. In an example, FIG. 11 illustrates a cross-sectional view of a lighting device 1100 with a polymer matrix layer having a composition with a dispersion of quantum dots coated with a semiconductor coating having a geometry with squared-off ends therein, in accordance with another embodiment of the present invention. Referring to FIG. 11, the lighting device 1100 includes a blue LED structure 1102. A quantum dot down converter screen 1104 is positioned somewhat remotely from the blue LED structure 1102. The quantum dot down converter screen 1104 includes a polymer matrix layer with a composition having a dispersion of quantum dots therein, e.g., of varying color, or a combination of a dispersion of quantum dots and conventional phosphors. In one embodiment, the device 1100 can be used to generate white light, as depicted in FIG. 11.

Figure 12:
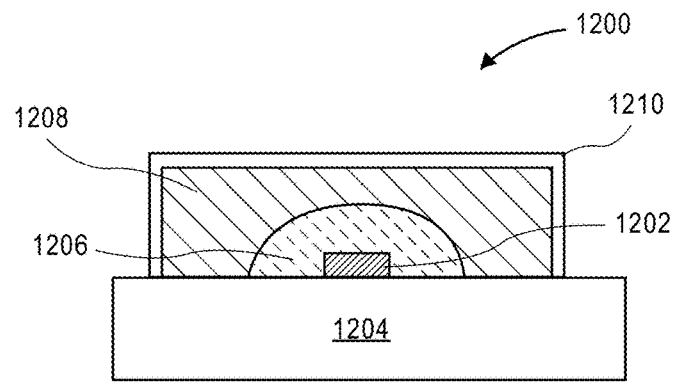
FIG. 12 illustrates a cross-sectional view of a lighting device with a layer having a polymer matrix with a dispersion of quantum dots coated with a semiconductor coating having a geometry with squared-off ends therein, in accordance with another embodiment of the present invention.

In another example, FIG. 12 illustrates a cross-sectional view of a lighting device 1200 with a layer having a polymer matrix composition with a dispersion of quantum dots coated with a semiconductor coating having a geometry with squared-off ends therein, in accordance with another embodiment of the present invention. Referring to FIG. 12, the lighting device 1200 includes a blue LED structure 1202 supported on a substrate 1204 which may house a portion of the electrical components of the blue LED structure 1202. A first conversion layer 1206 has a polymer matrix composition that includes a dispersion of red-light emitting anisotropic quantum dots therein. A second conversion layer 1208 has a second polymer matrix composition that includes a dispersion of quantum dots or green or yellow phosphors or a combination thereof (e.g., yttrium aluminum garnet, YAG phosphors) therein. Optionally, a sealing layer 1210 may be formed over the second conversion layer 1208, as depicted in FIG. 12. In one embodiment, the device 1200 can be used to generate white light.

Figure 13:
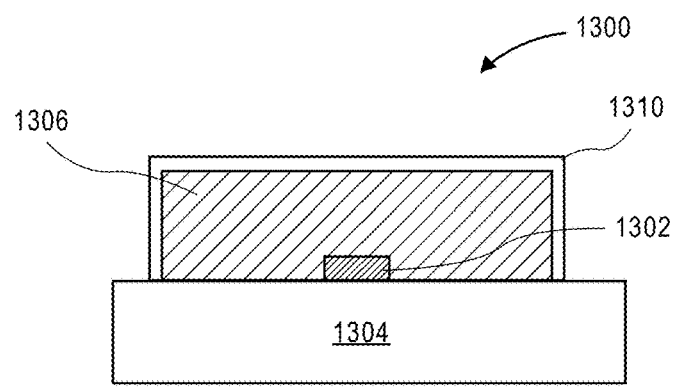
FIG. 13 illustrates a cross-sectional view of a lighting device with a layer having a polymer matrix with a dispersion of quantum dots coated with a semiconductor coating having a geometry with squared-off ends therein, in accordance with another embodiment of the present invention.

In another example, FIG. 13 illustrates a cross-sectional view of a lighting device 1300 with a layer having a polymer matrix composition with a dispersion of quantum dots coated with a semiconductor coating having a geometry with squared-off ends therein, in accordance with another embodiment of the present invention. Referring to FIG. 13, the lighting device 1300 includes a blue LED structure 1302 supported on a substrate 1304 which may house a portion of the electrical components of the blue LED structure 1302. A single conversion layer 1306 has a polymer matrix composition that includes a dispersion of red-light emitting anisotropic quantum dots in combination with a dispersion of green quantum dots or green and/or yellow phosphors therein. Optionally, a sealing layer 1310 may be formed over the single conversion layer 1306, as depicted in FIG. 13. In one embodiment, the device 1300 can be used to generate white light.

Figure 14A:
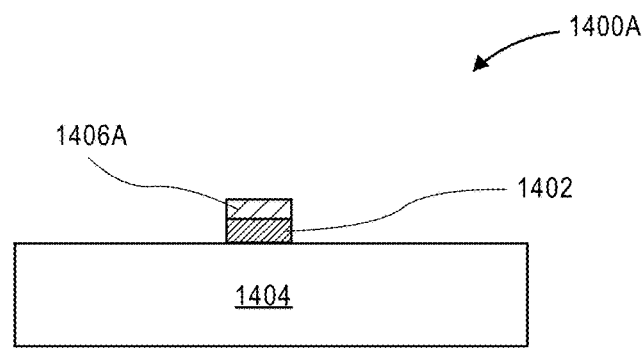
FIGS. 14A-14C illustrate cross-sectional views of various configurations for lighting devices with a layer having a polymer matrix with a dispersion of quantum dots coated with a semiconductor coating having a geometry with squared-off ends therein, in accordance with another embodiment of the present invention.
Figure 14B:
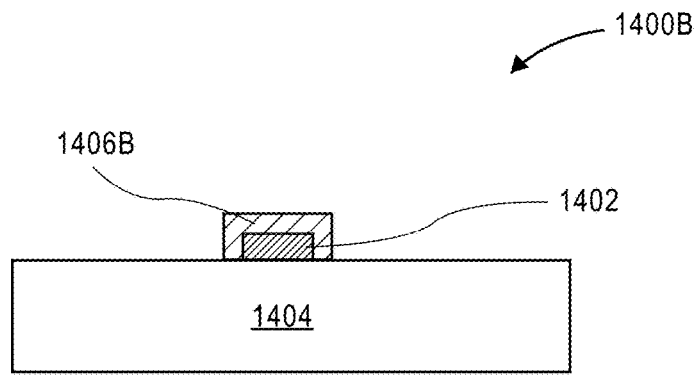
Figure 14C:
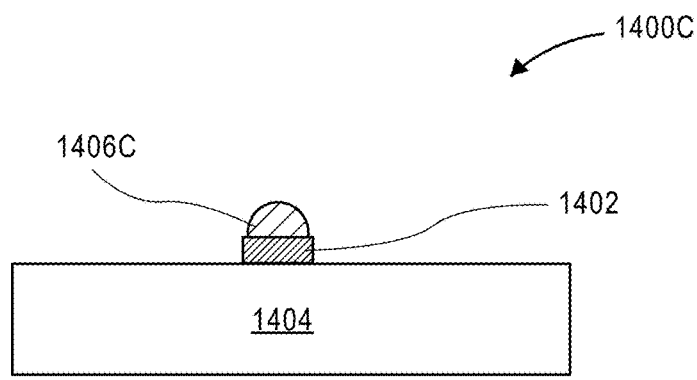

In additional examples, FIGS. 14A-14C illustrate cross-sectional views of various configurations for lighting devices 1400A-1400C with a layer having a polymer matrix composition with a dispersion of quantum dots coated with a semiconductor coating having a geometry with squared-off ends therein, respectively, in accordance with another embodiment of the present invention. Referring to FIGS. 14A-14C, the lighting devices 1400A-1400C each include a blue LED structure 1402 supported on a substrate 1404 which may house a portion of the electrical components of the blue LED structure 1402. A conversion layer 1406A-1406C, respectively, has a polymer matrix composition that includes a dispersion of one or more light-emitting color types of quantum dots therein. Referring to FIG. 14A specifically, the conversion layer 1406A is disposed as a thin layer only on the top surface of the blue LED structure 1402. Referring to FIG. 14B specifically, the conversion layer 1406B is disposed as a thin layer conformal with all exposed surfaces of the blue LED structure 1402. Referring to FIG. 14C specifically, the conversion layer 1406C is disposed as a "bulb" only on the top surface of the blue LED structure 1402. In the above examples (e.g., FIGS. 9-13 and 14A-14C), although use with a blue LED is emphasized, it is to be understood that a layer having a composition with a dispersion of quantum dots coated with a semiconductor coating having a geometry with squared-off ends therein can be used with other light sources as well, including LEDs other than blue LEDs.

Thus, squared-off semiconductor coatings for quantum dots (QDs) and the resulting quantum dot materials have been disclosed.

What is claimed is:
1. A semiconductor structure, comprising:
   a quantum dot structure having an outermost surface; and
   a crystalline semiconductor coating disposed on and completely surrounding the outermost surface of the quantum dot structure, and having a geometry with squared-off ends, the crystalline semiconductor coating comprising:
      a first sub-layer comprising a blended CdZnS layer directly grown from a CdS material of the quantum dot structure, and
      a second sub-layer comprising essentially pure ZnS.
2. The semiconductor structure of claim 1, wherein the quantum dot structure is a rod-shaped structure having a long axis, and wherein the squared-off ends of the crystalline semiconductor coating are aligned with respective ends of the long axis of the quantum dot structure.
3. The semiconductor structure of claim 2, wherein respective ends of the long axis of the quantum dot structure are rounded ends.
4. The semiconductor structure of claim 1, wherein the semiconductor structure has a PLQY of greater than 75% under conditions of a temperature greater than approximately 100 degrees Celsius and a flux greater than approximately 10 W/cm$^2$.
5. The semiconductor structure of claim 1, wherein the second sub-layer is stabilized with oleylamine molecules.
6. The semiconductor structure of claim 1, wherein the quantum dot structure is in alignment with a global center of the crystalline semiconductor coating.
7. The semiconductor structure or claim 1, wherein the quantum dot structure is not in alignment with a global center of the crystalline semiconductor coating.
8. A semiconductor structure, comprising:
   a nanocrystalline core of a first semiconductor material;
   a nanocrystalline shell of a second semiconductor material different from the first semiconductor material, the second semiconductor material comprising cadmium sulfide (CdS), the nanocrystalline shell disposed on and surrounding the nanocrystalline core; and
   a crystalline semiconductor coating of a third semiconductor material different from the first and second semiconductor materials, the third semiconductor material comprising a first sub-layer comprising a blended cadmium zinc sulfide (CdZnS) layer directly grown from the CdS material of the nanocrystalline shell, and a second sub-layer comprising essentially pure zinc sulfide (ZnS), the crystalline semiconductor coating disposed on and completely surrounding the nanocrystalline shell, and having a geometry with squared-off ends.
9. The semiconductor structure of claim 8, wherein the nanocrystalline shell is a rod-shaped structure having a long axis, and wherein the squared-off ends of the crystalline semiconductor coating are aligned with respective ends of the long axis of the nanocrystalline shell.
10. The semiconductor structure of claim 9, wherein respective ends of the long axis of the nanocrystalline shell are rounded ends.
11. The semiconductor structure of claim 8, wherein the semiconductor structure has a PLQY of greater than 75% under conditions of a temperature greater than approximately 100 degrees Celsius and a flux greater than approximately 10 W/cm$^2$.
12. The semiconductor structure of claim 8, wherein the first semiconductor material is cadmium selenide (CdSe).
13. The semiconductor structure of claim 8, wherein the second sub-layer is stabilized with oleylamine molecules.

14. The semiconductor structure or claim 8, wherein the nanocrystalline shell is in alignment with a global center of the crystalline semiconductor coating.

15. The semiconductor structure or claim 8, wherein the nanocrystalline shell is not in alignment with a global center of the crystalline semiconductor coating.

16. A lighting apparatus, comprising:
a housing structure;
a light emitting diode supported within the housing structure; and
a light conversion layer disposed above the light emitting diode, the light conversion layer comprising a plurality of quantum dots, each quantum dot comprising:
a nanocrystalline core of a first semiconductor material;
a nanocrystalline shell of a second semiconductor material different from the first semiconductor material, the nanocrystalline shell disposed on and surrounding the nanocrystalline core; and
a crystalline semiconductor coating of a third semiconductor material different from the first and second semiconductor materials, the crystalline semiconductor coating disposed on and completely surrounding the nanocrystalline shell, and having a geometry with squared-off ends, the crystalline semiconductor coating comprising:
a first sub-layer comprising a blended CdZnS layer directly grown from a CdS material of the nanocrystalline shell, and
a second sub-layer comprising essentially pure ZnS.

17. The lighting apparatus of claim 16, wherein, for each quantum dot, the nanocrystalline shell is a rod-shaped structure having a long axis, and the squared-off ends of the crystalline semiconductor coating are aligned with respective ends of the long axis of the nanocrystalline shell.

18. The lighting apparatus of claim 17, wherein, for each quantum dot, respective ends of the long axis of the nanocrystalline shell are rounded ends.

19. The lighting apparatus of claim 16, wherein, for each quantum dot, the quantum dot has a PLQY of greater than 75% under conditions of a temperature greater than approximately 100 degrees Celsius and a flux greater than approximately 10 W/cm$^2$.

20. The lighting apparatus of claim 16, wherein, for each quantum dot, the first semiconductor material is cadmium selenide (CdSe) and the second semiconductor material is cadmium sulfide (CdS).

21. The lighting apparatus of claim 16, wherein, for each quantum dot, the second sub-layer is stabilized with oleylamine molecules.

22. The lighting apparatus of claim 16, wherein, for each quantum dot, the nanocrystalline shell is in alignment with a global center of the crystalline semiconductor coating.

23. The lighting apparatus of claim 16, wherein, for each quantum dot, the nanocrystalline shell is not in alignment with a global center of the crystalline semiconductor coating.

* * * * *